(12) United States Patent
Nakatsuka et al.

(10) Patent No.: US 7,012,285 B2
(45) Date of Patent: Mar. 14, 2006

(54) SEMICONDUCTOR DEVICE

(75) Inventors: Tadayoshi Nakatsuka, Toyonaka (JP); Toshiharu Tambo, Kyoto (JP); Takahiro Kitazawa, Uozu (JP); Akiyoshi Tamura, Suita (JP); Katsuyoshi Tara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 314 days.

(21) Appl. No.: 10/416,261

(22) PCT Filed: Sep. 12, 2002

(86) PCT No.: PCT/JP02/09384

§ 371 (c)(1),
(2), (4) Date: May 8, 2003

(87) PCT Pub. No.: WO03/026013

PCT Pub. Date: Mar. 27, 2003

(65) Prior Publication Data

US 2004/0026742 A1 Feb. 12, 2004

(30) Foreign Application Priority Data

Sep. 14, 2001 (JP) ........................................ 2001-280061

(51) Int. Cl.
*H01L 31/072* (2006.01)

(52) U.S. Cl. ........................ 257/190; 257/192; 257/217; 257/280; 257/379; 257/536

(58) Field of Classification Search ................ 257/190, 257/192, 217, 280, 379, 536
See application file for complete search history.

(56) References Cited

U.S. PATENT DOCUMENTS 4,810,907 A * 3/1989 Tohyama ..................... 326/68
5,153,682 A * 10/1992 Goto et al. .................. 257/194
5,196,358 A * 3/1993 Boos ........................... 438/186
5,686,740 A * 11/1997 Hida ............................ 257/192
5,774,792 A    6/1998 Tanaka et al.

FOREIGN PATENT DOCUMENTS

| EP | 0 613 191  | 8/1994 |
| JP | 5-259192   | 10/1993 |
| JP | 6-132310   | 5/1994 |
| JP | 11-283995  | 10/1999 |

OTHER PUBLICATIONS

Inamori, et al."A New GaAs Variable–Gain Amplifier MMIC with a Wide–Dynamic–Range and Low–Voltage–Operation Linear Attenuation Circuit", IEEE Transactions on Micorwave Theory and techniques vol. 48, No. 2, pp. 182–186, Feb. 2000.

* cited by examiner

*Primary Examiner*—Tom Thomas
*Assistant Examiner*—Matthew E. Warren
(74) *Attorney, Agent, or Firm*—Merchant & Gould P.C.

(57) ABSTRACT

A semiconductor device whose insertion loss is reduced and isolation characteristics are improved in a high frequency band by reducing the capacitance component when an FET is off is provided. FETs (30a, 30b) having a gate electrode with a gate length of not more than 0.8 $\mu$m are formed on a semiconductor substrate in which a buffer layer (24) having an impurity concentration of at least $10^{10}$ cm$^{-3}$ and at most $10^{14}$ cm$^{-3}$ is formed on a semi-insulating semiconductor (25) having at least $10^{14}$ cm$^{-3}$ and at most $10^{16}$ cm$^{-3}$ p-type or n-type impurities and an active layer (23) having a p-type or n-type impurity concentration of at least $10^{15}$ cm$^{-3}$ and at most $10^{17}$ cm$^{-3}$ is formed on the buffer layer. N FETs are combined with each other, and when $1 \leq m \leq n-1$ (n and m are integers, n>1), a drain terminal of an m-th FET is connected to a source terminal of an (m+1)th FET, resistors (41a, 41b) are connected to the gate electrodes of all of the first to n-th FETs, and all of the other ends of the resistors are coupled to the same electric potential.

10 Claims, 13 Drawing Sheets

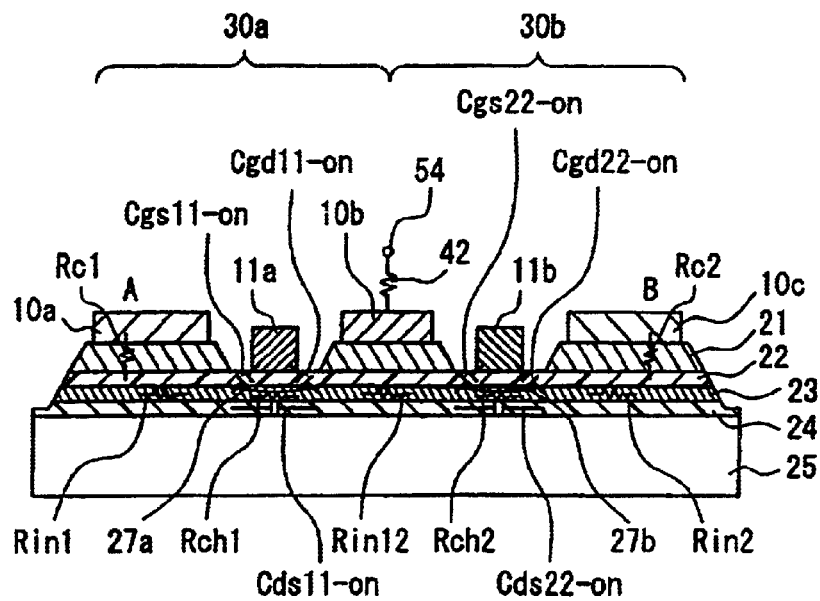
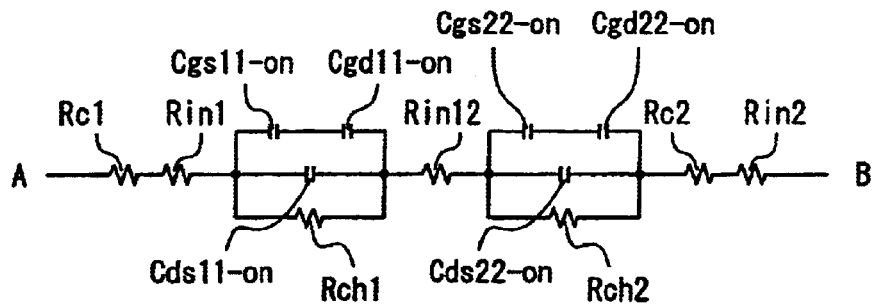
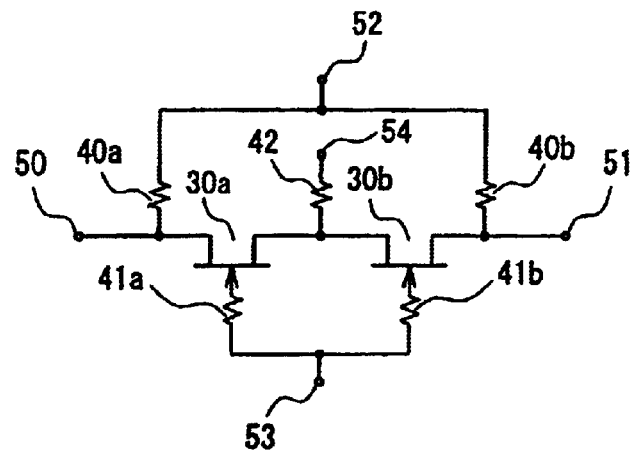
FIG. 5A
FIG. 5B
FIG. 5C

SEMICONDUCTOR DEVICE

TECHNICAL FIELD

The present invention relates to semiconductor devices, for example, for amplifying or switching signals in mobile communication apparatuses and the like, in particular to MES (metal semiconductor) FETs.

BACKGROUND ART

A conventional MESFET (hereinafter, also simply referred to as "FET") will be described with reference to FIG. 11A, FIG. 11B, FIG. 11C, FIG. 12A and FIG. 12B. FIG. 11A shows a cross-sectional view of the structure of a MESFET in the ON-state, formed on a GaAs semi-insulating substrate, FIG. 11B shows an equivalent circuit diagram corresponding to FIG. 11A, FIG. 11C shows a circuit diagram when the FET in FIG. 11A is switched, FIG. 12A shows a cross-sectional view of the structure in the OFF-state and FIG. 12B shows an equivalent circuit diagram corresponding to FIG. 12A.

In FIG. 11A and FIG. 11B, numeral 10a denotes a source electrode. Numeral 10b denotes a drain electrode. Numeral 11a denotes a Schottky gate electrode. Numeral 21 denotes a GaAs ohmic contact layer. Numeral 22 denotes an AlGaAs undoped layer. Numeral 23 denotes an AlGaAs active layer. Numeral 24 denotes a buffer layer in which AlGaAs layers and GaAs layers are laminated alternately and numeral 25 denotes the GaAs semi-insulating semiconductor substrate. In addition, numeral 27a denotes a depletion layer.

Moreover, Cgs_on indicates the gate-source capacitance in the ON-state. Cgd_on indicates the gate-drain capacitance in the ON-state. Cds_on indicates the drain-source capacitance in the ON-state. Rch indicates the channel resistance in the ON-state. Rc1 indicates the contact resistance between the source electrode 10a and the ohmic contact layer 21. Rc2 indicates the contact resistance between the drain electrode 10b and the ohmic contact layer 21. Rin1 indicates the resistance component existing between the source and the gate other than Rch and Rin2 indicates the resistance component existing between the drain and the gate other than Rch.

In FIG. 11C, numeral 30a denotes the FET. Numerals 40a, 40b and 41a denotes bias resistances. Numeral 50 denotes an input terminal. Numeral 51 denotes an output terminal. Numeral 52 denotes a drain-source bias terminal and numeral 53 denotes a gate bias terminal.

FIG. 12A shows a cross-sectional view of the structure of the FET 30a in the OFF-state. FIG. 12A is different from FIG. 11A in that Cgs_off indicates the gate-source capacitance in the OFF-state, Cgd_off indicates the gate-drain capacitance in the OFF-state and Cds_off indicates the drain-source capacitance in the OFF-state and that Rch is so high that it is negligible in the equivalent circuit.

The gate width of the FET 30a shown in the conventional example is 1 mm and the gate electrode 11a has a gate length of 0.5 µm. A standard value of Rch is 1.0 Ω/mm.

Next, a method for switching the conventional FET configured as above will be described.

First, in order to turn the FET on, a voltage of 0 V is applied to the drain-source bias terminal 52 and a voltage of 0 V or a positive voltage not higher than the Schottky barrier potential (about 0.7 V) is applied to the gate bias terminal 53. Thus, the FET 30a becomes forward biased and is turned on between the drain and the source. At this time, as shown in FIG. 11A, the channel of the FET 30a is opened and transmission of signals becomes possible, so that signals can be transmitted from a point A to a point B.

At this time, as shown in FIG. 11B, the equivalent circuit for a region underneath the gate of the FET can be represented by a circuit in which a series capacitance of Cgs_on and Cgd_on is connected in parallel with Cds_on and Rch. Usually, in frequency bands used for mobile communications, the impedance of Rch is much lower than those of the capacitance components and is dominant. In the conventional example, the on-resistance (Ron) that indicates the sum of the resistance components within the FET in the ON-state is about 1.5 Ω.

The insertion loss, which represents the characteristics of a switching circuit in the ON-state, is proportional to Ron. Among the resistance components constituting Ron, Rch is most dominant, so that it is effective to decrease Rch in order to reduce the insertion loss. Generally, the shorter the gate length of the FET is or the larger the gate width Wg is, or the higher the concentration in the active layer is, the lower becomes Rch. At the same time, however, not only Cgs_on, Cgd_on and Cds_on but also Cgs_off, Cgd_off and Cds_off, which are the capacitances in the OFF-state, become higher.

On the other hand, as shown in FIG. 12A, in order to turn off the FET, the gate-source potential is set to the threshold potential of the FET or less, while keeping the potentials at the drain terminal and the source terminal unchanged. Thus, the channel of the FET closes and the FET is turned off. FIG. 12B shows the equivalent circuit of the FET in the OFF-state, from which it can be understood that a parallel capacitance of the series capacitance of Cgs_off and Cgd_off, and Cds_off is dominant in the OFF-state. For example, in the case of an FET having a gate width of 1 mm, the sum of the above-mentioned capacitances is about 0.1 pF. Isolation characteristics, which indicate the characteristics of the switching circuit in the OFF-state, represent the leakage of signals from input to output, and as the capacitance components between input and output increase, the isolation characteristics deteriorate.

However, in the conventional configuration described above, if the gate length is shortened to decrease the on-resistance for the purpose of reducing the insertion loss, then Cds increases. Moreover, if the concentration in the active layer is increased or the gate width is increased, then Cgs and Cgd also increase in addition to Cds. Therefore, the insertion loss in high frequency bands deteriorates and further, the isolation characteristics also deteriorate.

Moreover, also when the FET is used while being connected in parallel with a signal path, there is the problem that the insertion loss of the on-path deteriorates because of the increase in the capacitance component of the off-path.

DISCLOSURE OF INVENTION

The present invention solves the above-mentioned problems and it is an object thereof to provide a semiconductor device whose insertion loss is reduced and isolation characteristics are improved by reducing the capacitance component when an FET is off.

In order to achieve the object, a first semiconductor device according to the present invention includes a field effect transistor (FET) having a gate electrode with a gate length of not more than 0.8 µm formed on a semiconductor substrate in which a buffer layer having an impurity concentration of at least $10^{10}$ cm$^{-3}$ and at most $10^{14}$ cm$^{-3}$ is formed on a semi-insulating semiconductor having at least $10^{14}$ cm$^{-3}$ and at most $10^{16}$ cm$^{-3}$ p-type or n-type impurities, and at least one active layer having a p-type or n-type impurity concentration of at least $10^{15}$ cm$^{-3}$ and at most $10^{17}$ cm$^{-3}$ is formed on the buffer layer. N FETs are combined with each other, and when $1 \leq m \leq n-1$ (n and m are integers, n>1), a drain terminal of the m-th FET is connected to a source terminal of the (m+1)th FET, resistors are connected to the gate electrodes of all of the first to n-th FETs, and all of the other ends of the resistors are coupled to the same electric potential.

In this configuration, the reason that the impurity concentration in the semi-insulating semiconductor is set within a range of at least $10^{14}$ cm$^{-3}$ and at most $10^{16}$ cm$^{-3}$ is that sufficient functionality cannot be obtained when the impurity concentration is lower than $10^{14}$ cm$^{-3}$ or higher than $10^{16}$ cm$^{-3}$. Moreover, the reason that the impurity concentration in the buffer layer is set within a range of at least $10^{10}$ cm$^{-3}$ and at most $10^{14}$ cm$^{-3}$ is that sufficient functionality as a buffer layer cannot be obtained when the impurity concentration is lower than $10^{10}$ cm$^{-3}$ or higher than $10^{14}$ cm$^{-3}$. Furthermore, the reason that the impurity concentration in the active layer is set within a range of at least $10^{15}$ cm$^{-3}$ and at most $10^{17}$ cm$^{-3}$ is that sufficient functionality as an active layer cannot be obtained when the impurity concentration is lower than $10^{15}$ cm$^{-3}$ or higher than $10^{17}$ cm$^{-3}$.

In the first semiconductor device, it is preferable that when all of the FETs are on OFF-state, the gate-drain capacitance value of the first FET is set to not more than ⅔ of the gate-source capacitance value of the first FET, the gate-source capacitance value of the n-th FET is set to not more than ⅔ of the gate-drain capacitance value of the n-th FET, and when $2 \leq m$, the gate-source capacitance values and the gate-drain capacitance values of the second to (n−1)th FETs are set to not more than ⅔ of the gate-source capacitance value of the first FET or the gate-drain capacitance value of the n-th FET.

In this configuration, the reason that the capacitance ratio between each of the electrodes is set to not more than ⅔ is that when it is greater than ⅔, the increment of the insertion loss due to the increase in the resistance value exceeds the insertion loss reduction effect due to the reduction in the capacitance, so that a sufficient effect cannot be obtained.

Moreover, in the first semiconductor device, it is preferable that an electrode is formed on the buffer layer and any voltage between the first voltage as an upper limit and the second voltage as a lower limit is applied to the electrode. Here, the first voltage and the second voltage respectively indicate a high value and a low value of the control voltage of a switching circuit.

Moreover, in the first semiconductor device, it is preferable that any voltage between the first voltage as an upper limit and the second voltage as a lower limit is applied to a connection point between the drain terminal of the m-th FET and the source terminal of the (m+1)th FET. Here, the first voltage and the second voltage respectively indicate a high value and a low value of the control voltage of a switching circuit.

In order to achieve the object, a second semiconductor device according to the present invention includes a multi-gate FET having n (n>1) gate electrodes, each with a gate length of not more than 0.8 μm, formed on a semiconductor substrate in which a buffer layer having an impurity concentration of at least $10^{10}$ cm$^{-3}$ and at most $10^{14}$ cm$^{-3}$ is formed on a semi-insulating semiconductor having at least $10^{14}$ cm$^{-3}$ and at most $10^{16}$ cm$^{-3}$ p-type or n-type impurities, and at least one active layer having a p-type or n-type impurity concentration of at least $10^{15}$ cm$^{-3}$ and at most $10^{17}$ cm$^{-3}$ is formed on the buffer layer. Resistors are connected to all of the first to n-th gate electrodes, and all of the other ends of the resistors are coupled to the same electric potential.

In this configuration, the reasons for setting those ranges of impurity concentrations are the same as in the case of the first semiconductor device.

In the second semiconductor device, it is preferable that when the multi-gate FET is an OFF-state, the first gate-drain capacitance value is set to not more than ⅔ of the first gate-source capacitance value and the n-th gate-source capacitance value is set to not more than ⅔ of the n-th gate-drain capacitance value. In this configuration, the reason that the capacitance ratio between each of the electrodes is set to not more than ⅔ is that when it is greater than ⅔, the increment of the insertion loss due to the increase in the resistance value exceeds the insertion loss reduction effect due to the reduction in the capacitance, so that a sufficient effect cannot be obtained.

Moreover, in the second semiconductor device, it is preferable that an electrode is formed on the buffer layer and any voltage between the first voltage as an upper limit and the second voltage as a lower limit is applied to the electrode. Here, the first voltage and the second voltage respectively indicate a high value and a low value of the control voltage of a switching circuit.

Moreover, in the second semiconductor device, it is preferable that for $1 \leq m \leq n-1$ (m is an integer), an electrode is provided in a region on the active layer between the m-th gate electrode and the (m+1)th gate electrode, and any voltage between the first voltage as an upper limit and the second voltage as a lower limit is applied to the electrode. Here, the first voltage and the second voltage respectively indicate a high value and a low value of the control voltage to a switching circuit.

In the first and the second semiconductor devices, it is preferable that the buffer layer is formed by laminating two or more layers of different kinds of semiconductors, an electrode is formed on any of the layers of the buffer layer, and any voltage between a first voltage as an upper limit and a second voltage as a lower limit is applied to the electrode. Here, the first voltage and the second voltage indicate a high value and a low value of the control voltage to a switching circuit, respectively.

BRIEF DESCRIPTION OF DRAWINGS

FIG. 5A is a cross-sectional view of the structure of a MESFET, which is a semiconductor device according to Embodiment 3 of the present invention, in the ON-state.

FIG. 5B is an equivalent circuit diagram corresponding to FIG. 5A.

FIG. 5C is a circuit diagram when the FET in FIG. 5A is switched.

BEST MODE FOR CARRYING OUT THE INVENTION

Hereinafter, preferred embodiments of the present invention will be described with reference to the drawings.

Embodiment 1

Hereinafter, a MESFET that is a semiconductor device according to Embodiment 1 of the present invention will be described with reference to FIG. 1A, FIG. 1B, FIG. 1C, FIG. 2A and FIG. 2B.

Figure 1A:
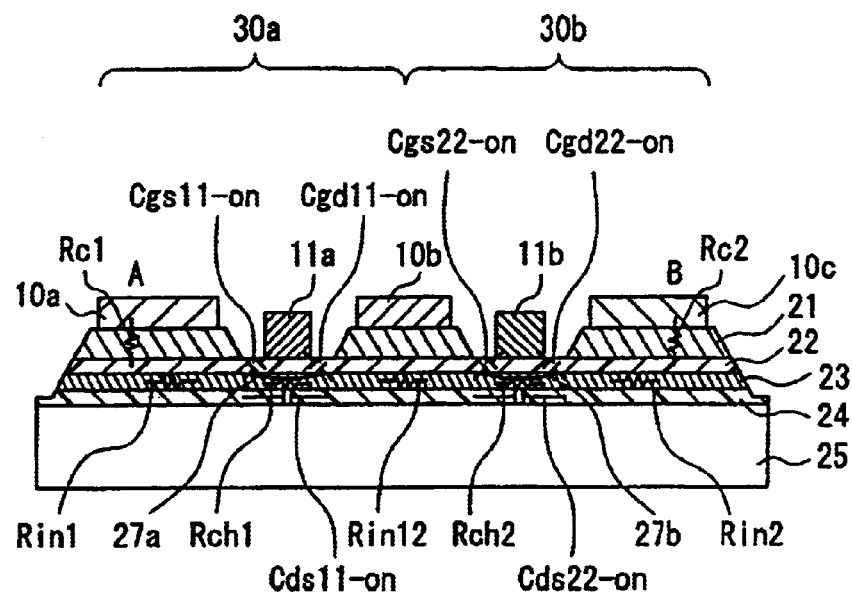
FIG. 1A is a cross-sectional view of the structure of a MESFET, which is a semiconductor device according to Embodiment 1 of the present invention, in the ON-state.
Figure 1B:
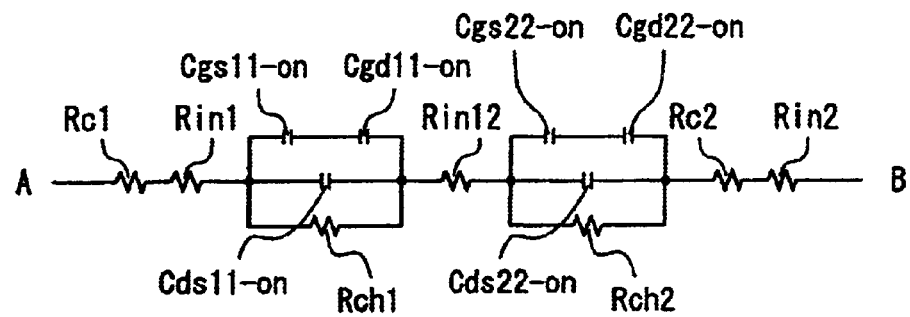
FIG. 1B is an equivalent circuit diagram corresponding to FIG. 1A.
Figure 1C:
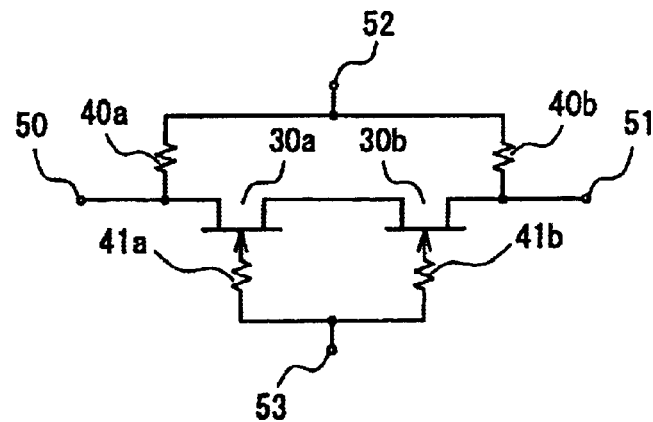
FIG. 1C is a circuit diagram when the FET in FIG. 1A is switched.
Figure 2A:
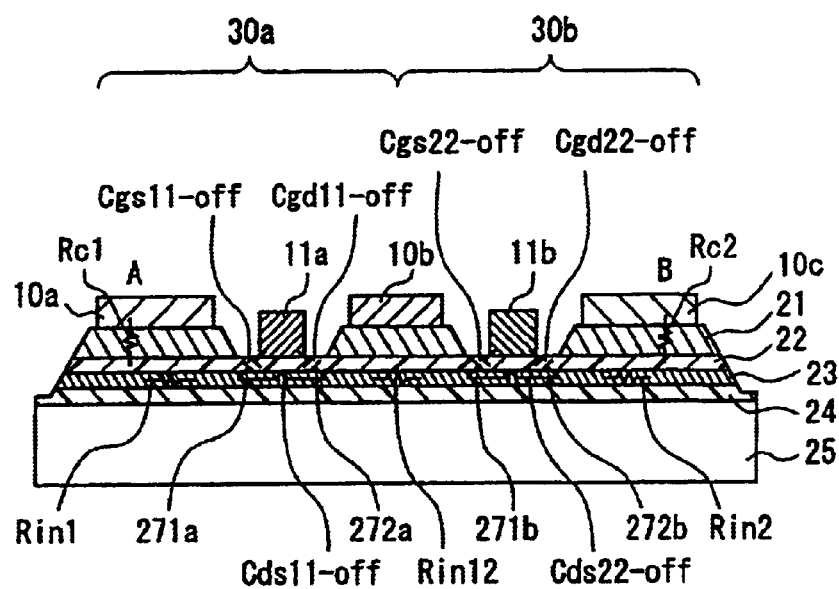
FIG. 2A is a cross-sectional view of the structure of the MESFET, which is the semiconductor device according to Embodiment 1 of the present invention, in the OFF-state.
Figure 2B:
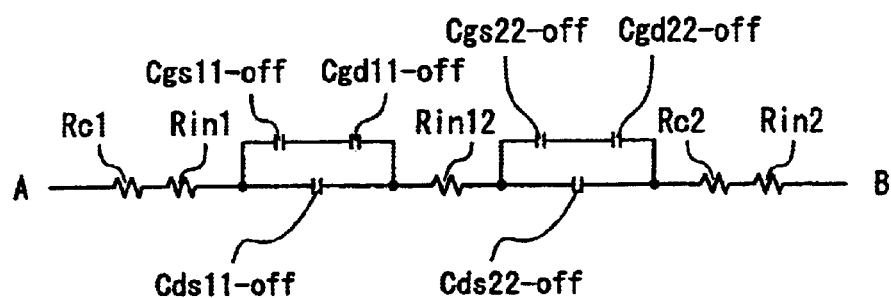
FIG. 2B is an equivalent circuit diagram corresponding to FIG. 2A.

FIG. 1A shows a cross-sectional view of the structure of the MESFET in the ON-state, formed on a GaAs semi-insulating substrate. FIG. 1B shows an equivalent circuit diagram corresponding to FIG. 1A. FIG. 1C shows a circuit diagram when the FET in FIG. 1A is switched. FIG. 2A shows a cross-sectional view of the structure of the MESFET in the OFF-state and FIG. 2B shows an equivalent circuit diagram corresponding to FIG. 2A.

In FIG. 1A, numeral 10a denotes a source electrode of an FET 30a. Numeral 10b denotes a drain electrode of the FET 30a and also a source electrode of an FET 30b. Numeral 11a denotes a Schottky gate electrode of the FET 30a. Cgs11__on indicates the gate-source capacitance of the FET 30a in the ON-state. Cgd11__on indicates the gate-drain capacitance of the FET 30a in the ON-state. Cds11__on indicates the drain-source capacitance of the FET 30a in the ON-state and Rch1 indicates the channel resistance of the FET 30a in the ON-state.

Moreover, numeral 10c denotes a drain electrode of the FET 30b. Numeral 11b denotes a Schottky gate electrode of the FET 30b. Cgs22__on indicates the gate-source capacitance of the FET 30b in the ON-state. Cgd22__on indicates the gate-drain capacitance of the FET 30b in the ON-state. Cds22__on indicates the drain-source capacitance of the FET 30b in the ON-state and Rch2 indicates the channel resistance of the FET 30b in the ON-state.

Furthermore, numeral 21 denotes a GaAs ohmic contact layer having a film thickness of 100 nm and an impurity density of $1.0 \times 10^{18}/cm^{-3}$. Numeral 22 denotes an AlGaAs undoped layer having a film thickness of 20 nm and an impurity density of $1.0 \times 10^{16}/cm^{-3}$. Numeral 23 denotes an AlGaAs active layer having a film thickness of 500 nm and an impurity density of $2.0 \times 10^{18}/cm^{-3}$. Numeral 24 denotes a superlattice-structured buffer layer having an impurity density of $1.0 \times 10^{15}/cm^{-3}$ in which five AlGaAs layers each with a film thickness of 5 nm and five GaAs layers each with a film thickness of 5 nm are laminated alternately, and numeral 25 denotes a GaAs semi-insulating semiconductor substrate having a substrate thickness of 450 $\mu$m and an impurity density of $1.0 \times 10^{15}/cm^{-3}$. In addition, numerals 27a and 27b denote depletion layers. Standard values of Rch1 and Rch2 are 1.0 $\Omega$/mm. Both of the gate electrodes 11a and 11b have a gate length of 0.5 $\mu$m.

In this embodiment, the FETs 30a and 30b share the active layer 23. However, they are separated from the other FETs formed on the same semiconductor substrate by etching so as not to share the active layer 23.

FIG. 2A is the cross-sectional view of the structure of the FET in the OFF-state. The configuration of FIG. 2A is different from that of FIG. 1A in that Cgs11__off indicates the gate-source capacitance of the FET 30a in the OFF-state, Cgd11__off indicates the gate-drain capacitance of the FET 30a in the OFF-state, Cds11__off indicates the drain-source capacitance of the FET 30a in the OFF-state, Cgs22__off indicates the gate-source capacitance of the FET 30b in the OFF-state, Cgd22__off indicates the gate-drain capacitance of the FET 30b in the OFF-state and Cds22__off indicates the drain-source capacitance of the FET 30b in the OFF-state, and that Rch1 and Rch2 are so high that they are negligible in the equivalent circuit.

Next, a method for switching the FET according to Embodiment 1 configured as above will be described.

First, as shown in FIG. 1A, the case where the FETs 30a and 30b are in the ON-state, that is to say, the case where signals are transmitted from a point A (in this case, the source terminal) to a point B (in this case, the drain terminal) will be described. In order to turn each of the FETs on, the source terminal and the drain terminal are set to 0 V and the gate terminal is set to 0.3 V. In this situation, a forward voltage of 0.3 V is applied between the gates and the drains, and the gates and the sources. Thus, the channels of the respective FETs open sufficiently, so that signals can be transmitted from the point A to the point B.

Moreover, as shown in FIG. 1B, for example, the equivalent circuit for the region underneath the gate of the FET 30a can be represented by a circuit in which a series capacitance of Cgs11_on and Cgd11_on is connected in parallel with Cds11_on and Rch1. Usually, in frequency bands used for mobile communications, the impedance of Rch1 is much lower than those of the capacitance components and is dominant.

On the other hand, as shown in FIG. 2A, in order to turn the FETs 30a and 30b off, the gate voltage is set to the threshold voltage or less, that is to −3 V in this case, while keeping the potentials at the drain terminal and the source terminal at 0 V. Thus, the channels of the FETs 30a and 30b close and both of the FETs are turned off.

Figure 13:
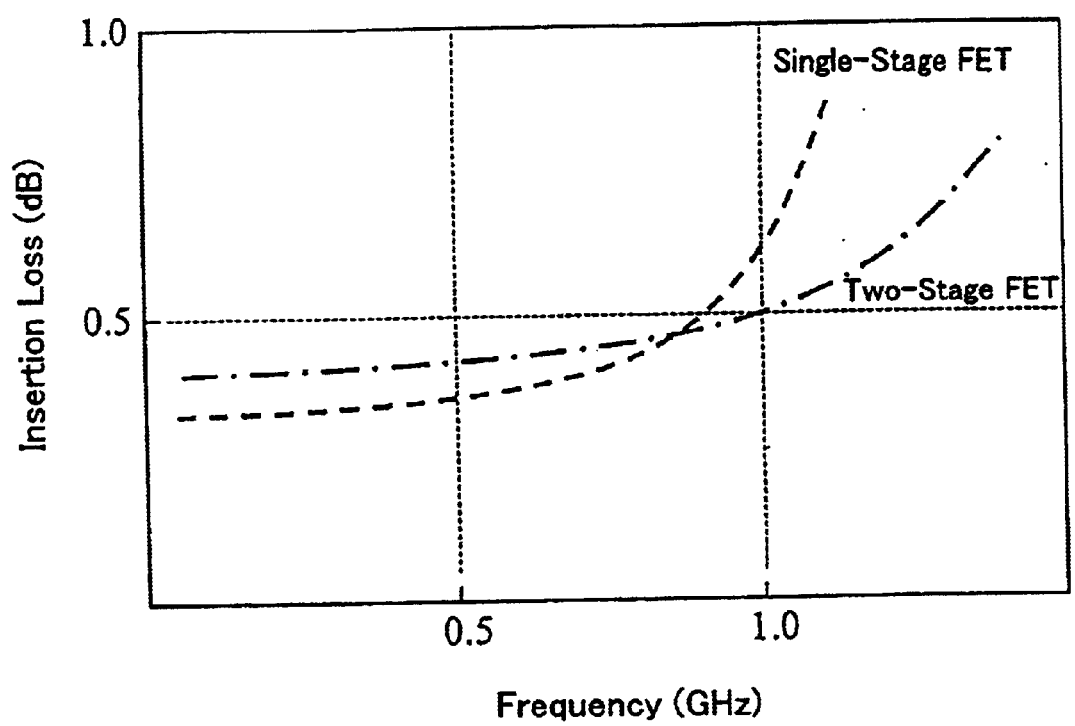
FIG. 13 is a diagram showing the frequency characteristics of the insertion losses in a conventional FET having a single-stage configuration and a FET having a two-stage configuration in accordance with the present invention.

In this embodiment, by using the above-mentioned concentration and thickness of the active layer, not only are the FETs 30a and 30b turned off sufficiently, but also the electric charge in the active layer under the electrode 10b becomes deficient at a gate voltage of −3 V. Therefore, the depletion layer 272a on the electrode 10b side of the gate 11a and the depletion layer 271b on the electrode 10b side of the gate 11b extend wider than the depletion layer 271a on the 10a side of the gate electrode 11a and the depletion layer 272b on the 10c side of the gate 11b, respectively. As a result, Cgd11_off and Cgs22_off become smaller (⅔ or less) than Cgs11_off and Cgd22_off, respectively, so that the capacitance between A and B in the equivalent circuit of FIG. 2B can be decreased. In the case of this embodiment, the capacitance value between A and B is 0.03 pF or lower, which is about ⅓ of that of the conventional configuration. Here, if the number of stages of the FET is set to two, then the on-resistance is doubled. However, as shown in FIG. 13, the frequency characteristics are improved because of the reduction of the capacitance value, and therefore, at a frequency at or above a critical point, the insertion loss becomes smaller when the number of stages of the FET is set to two.

In this embodiment, the active layer is a uniform AlGaAs layer. However, it should be obvious that the same effect also can be obtained using a single heterostructure or a double heterostructure. Moreover, in this embodiment, a superlattice structure is used as the buffer layer. However, it should be apparent that the same effect can be obtained using other structures.

Embodiment 2

Hereinafter, a MESFET that is a semiconductor device according to Embodiment 2 of the present invention will be described with reference to FIG. 3A, FIG. 3B, FIG. 3C, FIG. 4A and FIG. 4B.

Figure 3A:
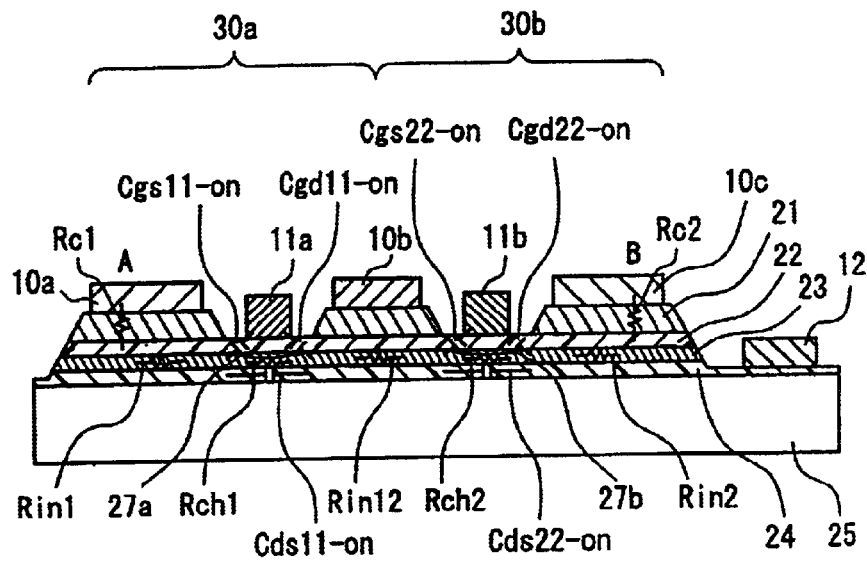
FIG. 3A is a cross-sectional view of the structure of MESFET, which is a semiconductor device according to Embodiment 2 of the present invention, in the ON-state.
Figure 3B:
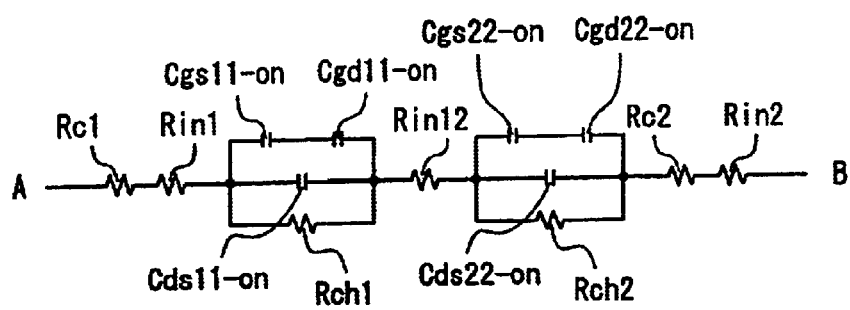
FIG. 3B is an equivalent circuit diagram corresponding to FIG. 3A.
Figure 3C:
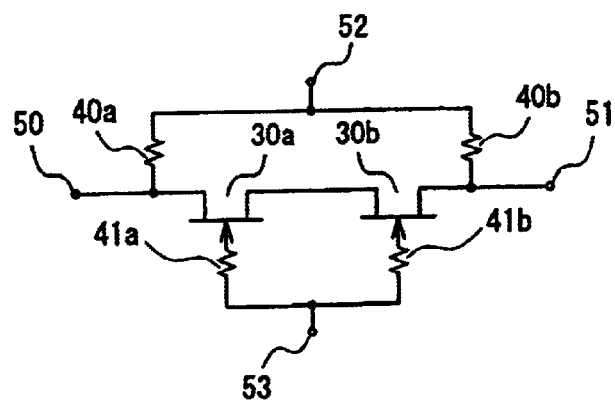
FIG. 3C is a circuit diagram when the FET in FIG. 3A is switched.
Figure 4A:
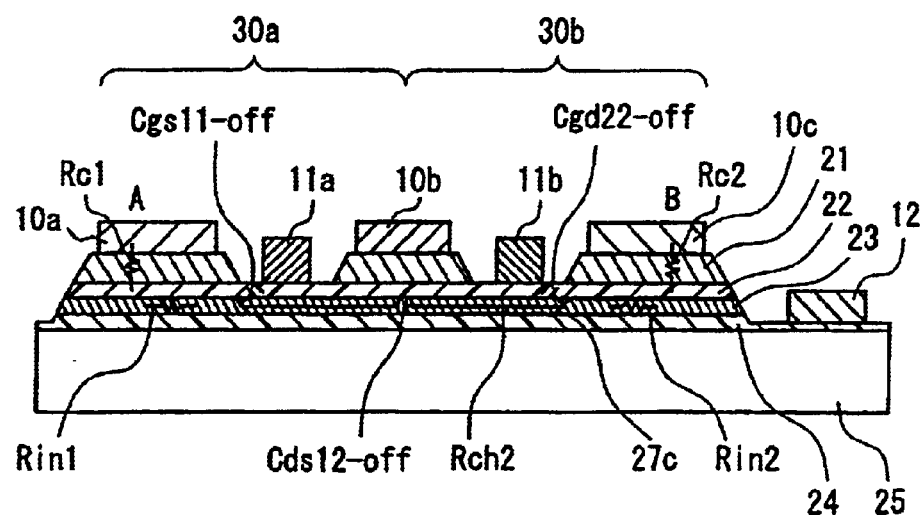
FIG. 4A is a cross-sectional view of the structure of the MESFET, which is the semiconductor device according to Embodiment 2 of the present invention, in the OFF-state.
Figure 4B:
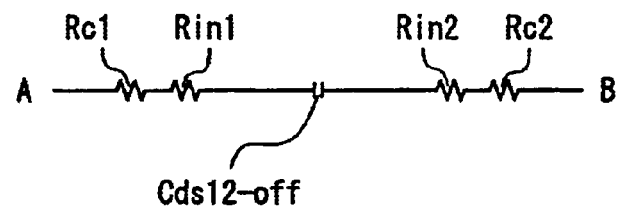
FIG. 4B is an equivalent circuit diagram corresponding to FIG. 4A.

FIG. 3A shows a cross-sectional view of the structure of the MESFET in the ON-state formed on a GaAs semi-insulating substrate. FIG. 3B shows an equivalent circuit diagram corresponding to FIG. 3A. FIG. 3C show a circuit diagram when the FET in FIG. 3A is switched. FIG. 4A shows a cross-sectional view of the structure of the MESFET in the OFF-state and FIG. 4B shows an equivalent circuit diagram corresponding to FIG. 4A.

The configuration of Embodiment 2 is different from that of Embodiment 1 in that an ohmic electrode 12 for voltage application is connected to the buffer layer 24. In the buffer layer 24, five layers, each of different kinds of semiconductors, are laminated. In this embodiment, two layers of the five layers are removed starting at the top layer, before the ohmic electrode 12 is connected.

Next, a method for switching the FET according to Embodiment 2 configured as above will be described.

First, as shown in FIG. 3A, the case where the FETs 30a and 30b are in the ON-state, that is to say, the case where signals are transmitted from the point A (in this case, the source terminal) to point B (in this case, the drain terminal) will be described. In order to turn each of the FETs on, the source terminal and the drain terminal are set to 0 V and the gate terminal is set to 0.3 V. In this situation, a forward voltage of 0.3 V is applied between the gates and the drains, and the gates and the sources. Thus, the channels of the respective FETs open sufficiently, so that signals can be transmitted from the point A to the point B. In this situation, a voltage of 0 V is applied to the ohmic electrode 12 for voltage application.

Moreover, as shown in FIG. 3B, for example, the equivalent circuit of the region underneath the gate of the FET 30a can be represented by a circuit in which a series capacitance of Cgs11_on and Cgd11_on is connected in parallel with Cds11_on and Rch1. Usually, in frequency bands used for mobile communications, the impedance of Rch1 is much lower than those of the capacitance components and is dominant. The resistance of the FETs 30a and 30b in the ON-state can be approximated by the sum of Rch1 and Rch2, and the on-resistance becomes 1.5 Ω or lower by using the FET having a gate width of 2 mm.

On the other hand, as shown in FIG. 4A, in order to turn the FETs 30a and 30b off, the gate voltage is set to the threshold voltage or less, that is, to −3 V in this case, while keeping the potentials at the drain terminal and the source terminal at 0 V. Thus, the channels of the FETs 30a and 30b close and both of the FETs are turned off.

In this situation, a voltage of 0 V is applied to the ohmic electrode 12 for voltage application. By setting the potential at the external ohmic electrode at 0 V, the electric charge in the region sandwiched between the depletion layers 27a and 27b in the ON-state can be dissipated to the ground. As a result, the depletion layers underneath the gates in the OFF-state extend over the entire active layer to form a single depletion layer 27c. Thus, Cdg11_off and Cgs22_off can be decreased to such an extent that they are negligible. Therefore, in the OFF-state, Cds12_off becomes a dominant and the series capacitance component of the FET in the OFF-state can be reduced. In the case of this embodiment, the value of Cds12_off is 0.02 pF, which is about ⅓ of that of the conventional configuration.

In this embodiment, the ohmic electrode 12 for voltage application is formed on the buffer layer 24. However, it should be obvious that the same effect also can be expected even when it is formed on the GaAs semi-insulating semiconductor substrate 25. Moreover, although an ohmic metal is used as the electrode for voltage application, the same effect also can be obtained with a Schottky junction metal.

Embodiment 3

Hereinafter, a MESFET that is a semiconductor device according to Embodiment 3 of the present invention will be described with reference to FIG. 5A, FIG. 5B, FIG. 5C, FIG. 6A and FIG. 6B.

Figure 6A:
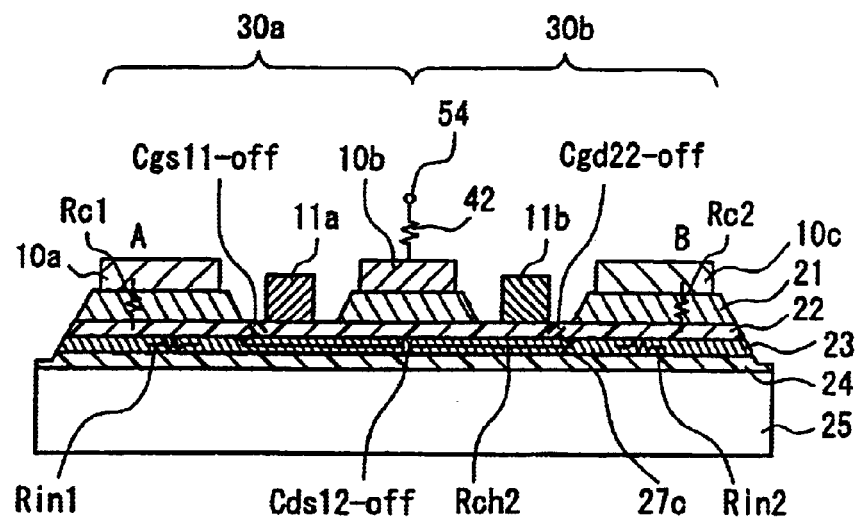
FIG. 6A is a cross-sectional view of the structure of the MESFET, which is the semiconductor device according to Embodiment 3 of the present invention, in the OFF-state.
Figure 6B:
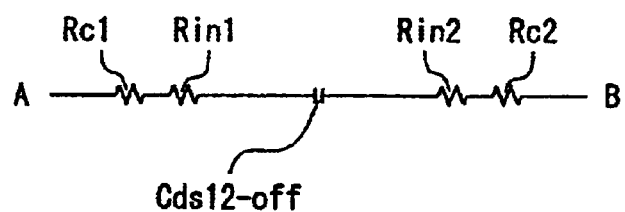
FIG. 6B is an equivalent circuit diagram corresponding to FIG. 6A.

FIG. 5A shows a cross-sectional view of the structure of the MESFET in the ON-state, formed on a GaAs semi-insulating substrate. FIG. 5B shows an equivalent circuit diagram corresponding to FIG. 5A. FIG. 5C shows a circuit diagram when the FET in FIG. 5A is switched. FIG. 6A shows a cross-sectional view of the structure of the MESFET in the OFF-state and FIG. 6B shows an equivalent circuit diagram corresponding to FIG. 6A.

Embodiment 3 is different from Embodiment 1 in that a voltage of 2.7 V is applied from a biasing terminal 54 via a resistor 42 to an ohmic electrode 10b that is the drain electrode of the FET 30a and also the source electrode of the FET 30b.

According to this configuration, the depletion layer 27c can be formed easily when the FETs 30a and 30b are off, without forming the ohmic electrode 12 for voltage application on the buffer layer 24 as in Embodiment 2. In the case of this embodiment, the value of Cds12_off is 0.02 pF, which is about ⅕ of that of the conventional configuration.

In this embodiment, a voltage of 2.7 V is applied to the biasing terminal 54. However, since the required minimum voltage applied to the biasing terminal 54 is determined by the electric power that is input and the threshold value of the FET, it should be obvious that the same effect also can be obtained even when a voltage that is different from 2.7 V is applied thereto.

Embodiment 4

Hereinafter, a MESFET that is a semiconductor device according to Embodiment 4 of the present invention will be described with reference to FIG. 7A, FIG. 7B, FIG. 7C, FIG. 8A and FIG. 8B.

Figure 7A:
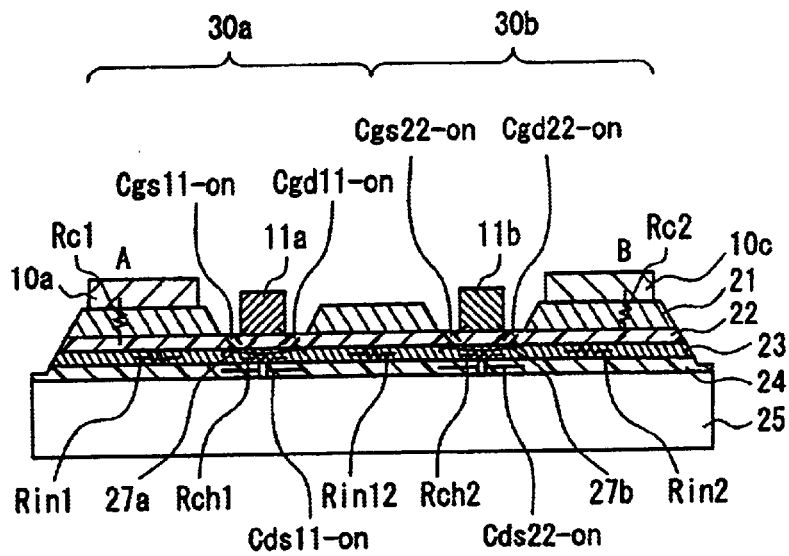
FIG. 7A is a cross-sectional view of the structure of a dual-gate MESFET, which is a semiconductor device according to Embodiment 4 of the present invention, in the ON-state.
Figure 7B:
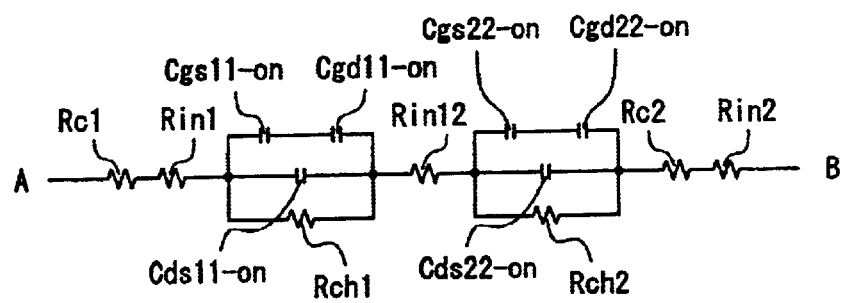
FIG. 7B is an equivalent circuit diagram corresponding to FIG. 7A.
Figure 7C:
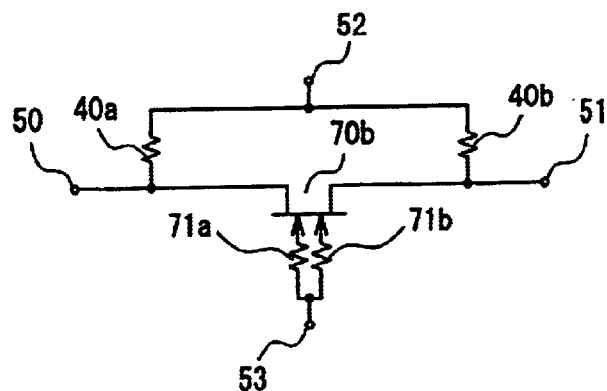
FIG. 7C is a circuit diagram when the FET in FIG. 7A is switched.
Figure 8A:
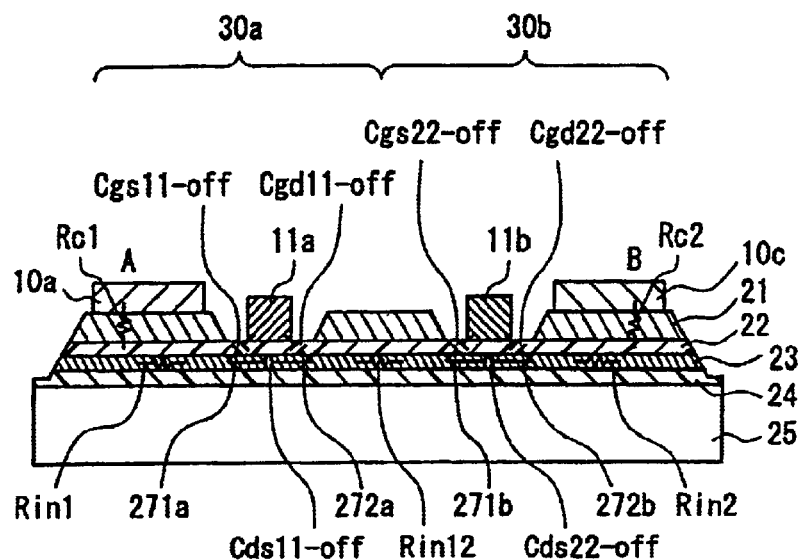
FIG. 8A is a cross-sectional view of the structure of the dual-gate MESFET, which is the semiconductor device according to Embodiment 4 of the present invention, in the OFF-state.
Figure 8B:
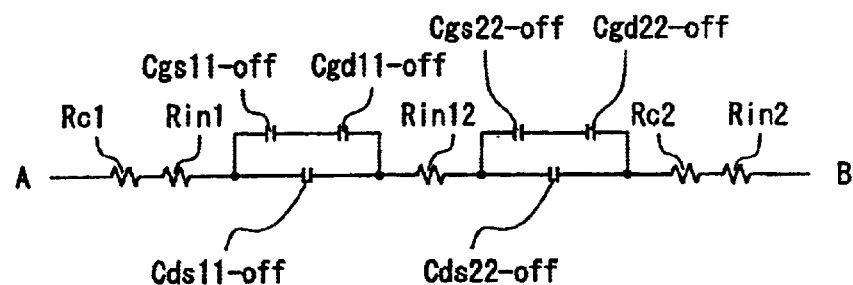
FIG. 8B is an equivalent circuit diagram corresponding to FIG. 8A.

FIG. 7A shows a cross-sectional view of the structure of a dual-gate MESFET in the ON-state, formed on a GaAs semi-insulating substrate. FIG. 7B shows an equivalent circuit diagram corresponding to FIG. 7A. FIG. 7C shows a circuit diagram when the FET in FIG. 7A is switched. FIG. 8A shows a cross-sectional view of the structure of the dual-gate MESFET in the OFF-state and FIG. 8B shows an equivalent circuit diagram corresponding to FIG. 8A.

In FIG. 7A, numeral 10a denotes a source electrode. Numeral 21b denotes an n+ region between gates. Numeral 10c denotes a drain electrode. Numeral 11a denotes a first gate electrode. Numeral 11b denotes a second gate electrode. $Cgs11_{13}$ on indicates the capacitance between the first gate and the source of the FET in the ON-state. $Cgd11_{13}$ on indicates the capacitance between the first gate and the n+ region between the gates of the FET in the ON-state. Cds11_on indicates the capacitance between the first source and the n+ region between the gates of the FET in the ON-state. Rch1 indicates the channel resistance of the first gate region. Cgs22_on indicates the capacitance between the second gate and the n+ region between the gates. Cgd22_on indicates the capacitance between the second gate and the drain. Cds22_on indicates the capacitance between the second source and the n+ region between the gates of the FET in the ON-state and Rch2 indicates the channel resistance of the second gate region.

Moreover, numeral 21 denotes a GaAs ohmic contact layer having a film thickness of 100 nm and an impurity density of $1.0 \times 10^{18}/cm^{-3}$. Numeral 22 denotes an AlGaAs undoped layer having a film thickness of 20 nm and an impurity density of $1.0 \times 10^{15}/cm^{-3}$. Numeral 23 denotes an AlGaAs active layer having a film thickness of 500 nm and an impurity density of $2.0 \times 10^{18}/cm^{-3}$. Numeral 24 denotes a superlattice-structured buffer layer having an impurity density of $1.0 \times 10^{15}/cm^{-3}$ in which five AlGaAs layers each with a film thickness of 5 nm and five GaAs layers each with a film thickness of 5 nm are laminated alternately. Numeral 25 denotes a GaAs semi-insulating semiconductor substrate having a substrate thickness of 450 μm and an impurity density of $1.0 \times 10^{15}/cm^{-3}$. Numeral 27b denotes a depletion layer under the first gate electrode and numeral 27b denotes a depletion layer under the second gate electrode. Standard values of Rch1 and Rch2 are 1.5 Ω/mm. Both of the gate electrodes 11a and 11b have a gate length of 0.5 μm.

In this embodiment, the first and the second gate of the dual-gate FET share the active layer 23. However, they are separated from the other FETs formed on the same semiconductor substrate by etching so as not to share the active layer 23. The gate width of the FET shown in this embodiment is 2 mm.

FIG. 8A is the cross-sectional view of the structure of the FET in the OFF-state. The configuration of FIG. 8A is different from that of FIG. 7A in that Cgs11_off indicates the capacitance between the first gate and the source of the FET in the OFF-state, Cgd11_off indicates the capacitance between the first gate and the n+ region betwene the gates of the FET in the OFF-state, Cds11_off indicates the capacitance between the first source and the n+ region between the gates of the FET in the OFF-state, Cgs22_off indicates the capacitance between the second gate and the n+ region between the gates, Cgd22_off indicates the capacitance between the second gate and the drain and Cds22_off indicates the capacitance between the second source and the n+ region between the gates of the FET in the OFF-state, and that Rch1 and Rch2 are so high that they are negligible in the equivalent circuit.

The method for switching the FET of FIG. 7A is the same as that in the case of Embodiment 1. The resistance of the FETs 30a and 30b in Embodiment 1 in the ON-state can be approximated by the sum of Rch1 and Rch2. However, according to this embodiment, Rin2 can be decreased in comparison with that in the case of the circuit in which two FETs are connected in series as shown in Embodiment 1. Therefore, when using an FET having a gate width of 2 mm, the on-resistance is 1.0 Ω or lower.

The reason that the on-resistance can be reduced as above is as follows. When the FETs are configured in two stages as in Embodiment 1, a spacing of 5 μm or more is required in order to join the source of the FET 30a and the drain of the FET 30b and form the electrode 10b at this joined portion. However, by providing the FET with a dual-gate structure as in this embodiment, the need for the electrode 10b is eliminated and only the n+ layer is required, so that the spacing can be decreased to about 2 μm, and consequently, the on-resistance can be reduced.

Embodiment 5

Hereinafter, a MESFET that is a semiconductor device according to Embodiment 5 of the present invention will be described with reference to FIG. 9A, FIG. 9B, FIG. 9C, FIG. 10A and FIG. 10B.

Figure 9A:
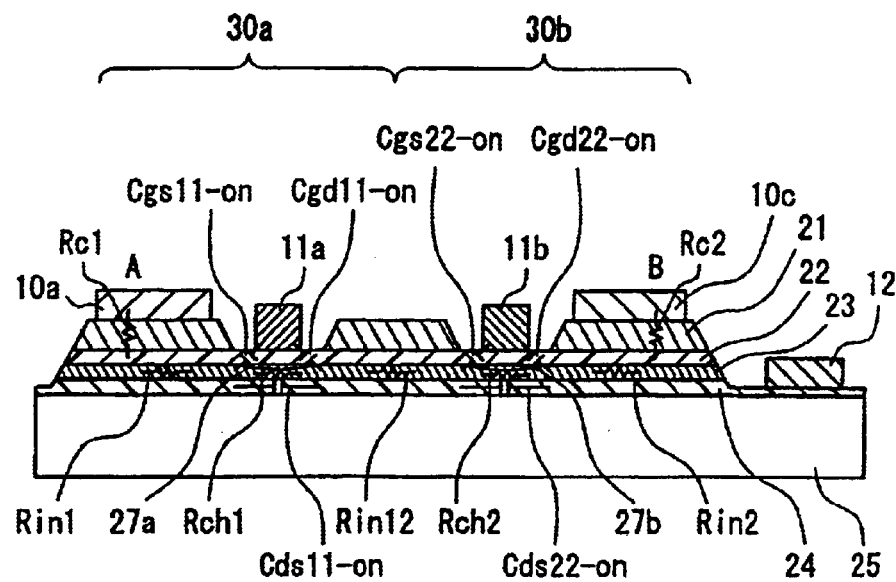
FIG. 9A is a cross-sectional view of the structure of a dual-gate MESFET, which is a semiconductor device according to Embodiment 5 of the present invention, in the ON-state.
Figure 9B:
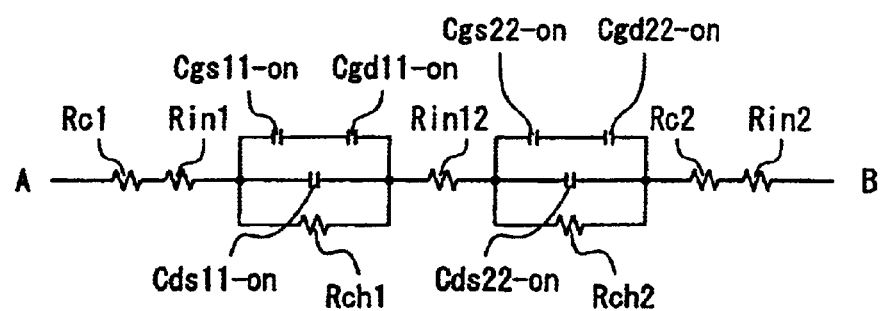
FIG. 9B is an equivalent circuit diagram corresponding to FIG. 9A.
Figure 9C:
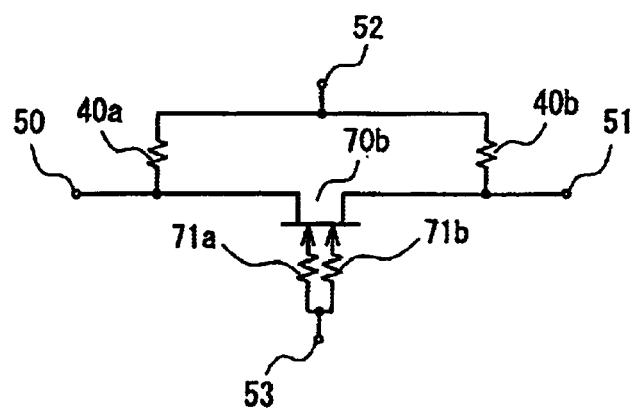
FIG. 9C is a circuit diagram when the FET in FIG. 9A is switched.
Figure 10A:
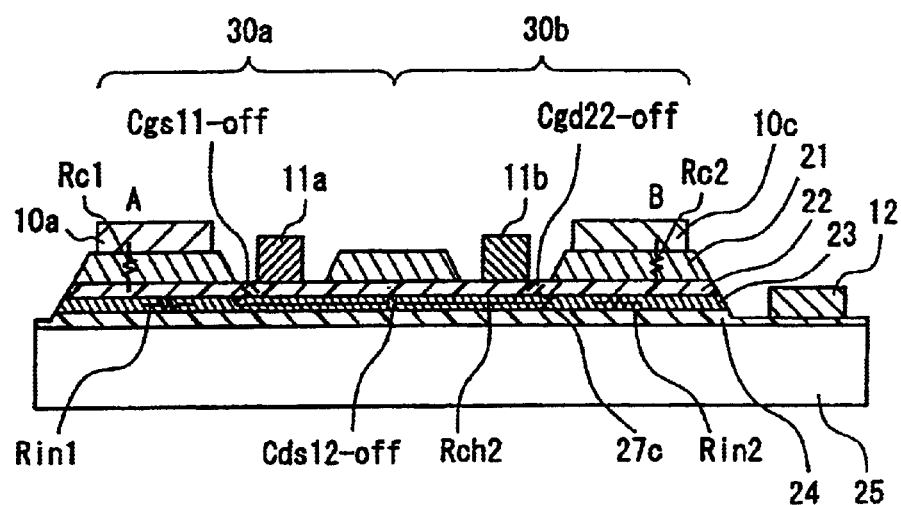
FIG. 10A is a cross-sectional view of the structure of the dual-gate MESFET, which is the semiconductor device according to Embodiment 5 of the present invention, in the OFF-state.
Figure 10B:
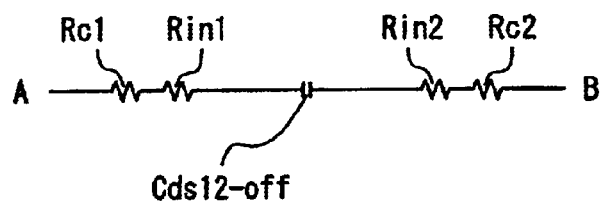
FIG. 10B is an equivalent circuit diagram corresponding to FIG. 10A.
Figure 11A:
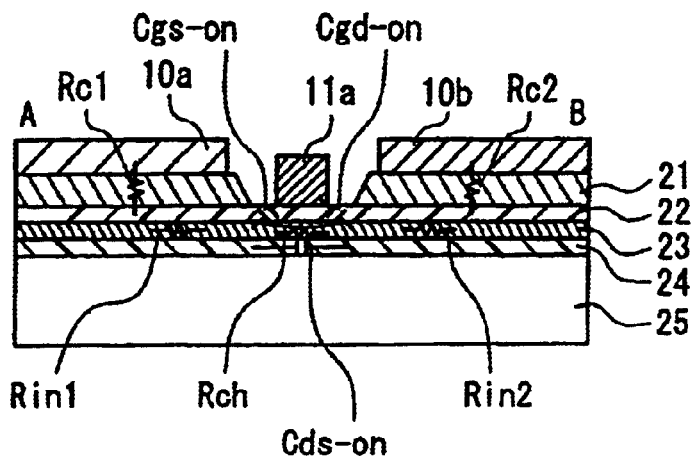
FIG. 11A is a cross-sectional view of the structure of a conventional MESFET in the ON-state.
Figure 11B:
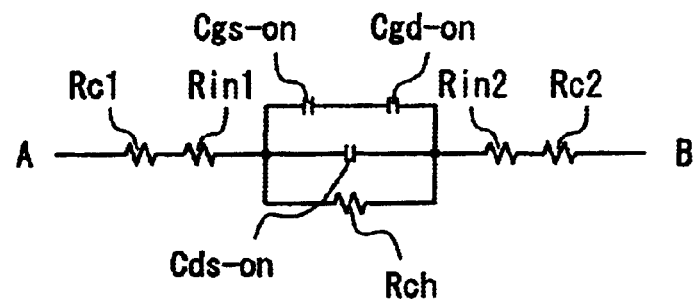
FIG. 11B is an equivalent circuit diagram corresponding to FIG. 11A.
Figure 11C:
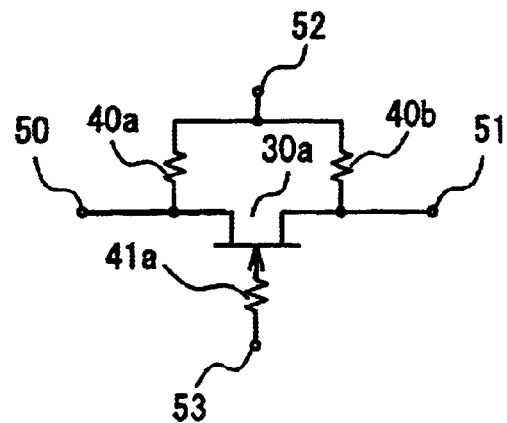
FIG. 11C is a circuit diagram when the FET in FIG. 11A is switched.
Figure 12A:
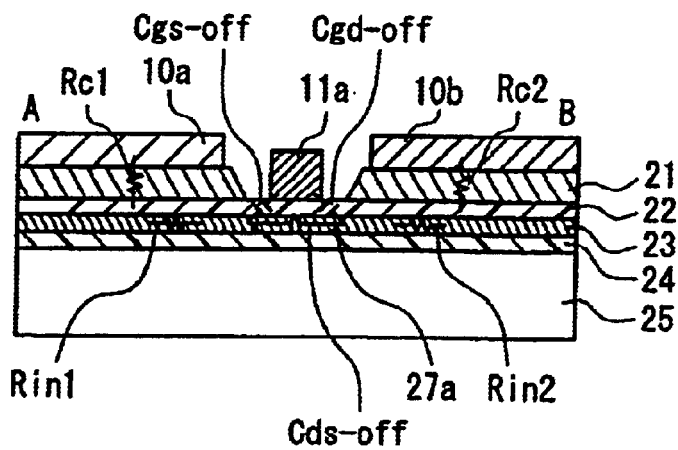
FIG. 12A is a cross-sectional view of the structure of the conventional MESFET in the OFF-state.
Figure 12B:
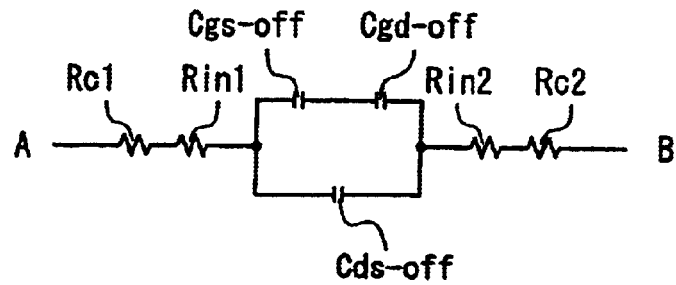
FIG. 12B is an equivalent circuit diagram corresponding to FIG. 12A.

FIG. 9A shows a cross-sectional view of the structure of the dual-gate MESFET in the ON-state, formed on a GaAs semi-insulating substrate. FIG. 9B shows an equivalent circuit diagram corresponding to FIG. 9A. FIG. 9C shows a circuit diagram when the FET in FIG. 9A is switched. FIG. 10A shows a cross-sectional view of the structure of the dual-gate MESFET in the OFF-state and FIG. 10B shows an equivalent circuit diagram corresponding to FIG. 10A.

The configuration of Embodiment 5 is different from that of Embodiment 4 in that an ohmic electrode 12 for voltage application is provided on the buffer layer 24. In this embodiment, a voltage of 0 V is applied to the ohmic electrode 12 for voltage application. Thus, the electric charge in the region sandwiched between the depletion layers 27a and 27b can be dissipated to the ground when the FET is off, and as a result, the depletion layers underneath the gates in the OFF-state extend over the entire active layer to form one depletion layer 27c. Thus, Cdg11_off and Cgs22_off can be decreased to such an extent that they are negligible. Therefore, in the OFF-state, Cds12_off becomes dominant and the series capacitance component of the FET in the OFF-state can be reduced. In the case of this embodiment, the value of Cds12_off is 0.02 pF, which is about ⅕ of that of the conventional configuration.

In this embodiment, the ohmic electrode 12 for voltage application is formed on the buffer layer 24. However, it should be obvious that the same effect also can be expected even when it is formed on the GaAs semi-insulating semiconductor substrate 25. Moreover, although an ohmic metal is used as the electrode for voltage application, the same effect can be obtained with a Schottky junction metal.

As described above, according to the preferred invention, it is possible to extend the width of a depletion layer within the active layer or deplete the entire active layer when the FET is off, so that the capacitance component between input and output can be significantly reduced and a semiconductor device having excellent isolation characteristics can be provided.

What is claimed is:

1. A semiconductor device comprising a field effect transistor (FET) having a gate electrode with a gate length of not more than 0.8 µm formed on a semiconductor substrate in which a buffer layer having an impurity concentration of at least $10^{10}$ cm$^{-3}$ and at most $10^{14}$ cm$^{-3}$ is formed in a semi-insulating semiconductor having at least $10^{14}$ cm$^{-3}$ and at most $10^{16}$ cm$^{-3}$ p-type or n-type impurities, and at least one active layer having a p-type or n-type impurity concentration of at least $10^{15}$ cm$^{-3}$ and at most $10^{17}$ cm$^{-3}$ is formed on the buffer layer, wherein n FETs are combined with each other, and when $1 \leq m \leq n-1$ (n and m are integers, n>1), a drain terminal of an m-th FET is connected to a source terminal of an (m+1)th FET, resistors are connected to the gate electrodes of all of the first to n-th FETs, and all of the other ends of the resistors are coupled to the same electric potential.

2. The semiconductor device according to claim 1, wherein, when the FETs are in an OFF-state, a gate-drain capacitance value of the first FET is set to not more than ⅔ of a gate-source capacitance value of the first FET, the gate-source capacitance value of the n-th FET is set to not more than ⅔ of the gate-drain capacitance value of the n-th FET, and for $2 \leq m$, the gate-source capacitance values and the gate-drain capacitance values of the second to (n−1)th FETs are set to not more than ⅔ of the gate-source capacitance value of the first FET or the gate-drain capacitance value of the n-th FET.

3. The semiconductor device according to claim 1, wherein an electrode is formed on the buffer layer, and a voltage between a first voltage as an upper limit and a second voltage as a lower limit is applied to the electrode.

4. The semiconductor device according to claim 1, wherein any voltage between a first voltage as an upper limit and a second voltage as a lower limit is applied to a connection point between the drain terminal of the m-th FET and the source terminal of the (m+1)th FET.

5. The semiconductor device according to claim 1, wherein the buffer layer is formed by laminating two or more layers of different kinds of semiconductors, an electrode is formed on any of the layers of the buffer layer, and a voltage between a first voltage as an upper limit and a second voltage as a lower limit is applied to the electrode.

6. A semiconductor device comprising a multi-gate FET having n (n>1) gate electrodes, each with a gate length of not more than 0.8 µm, formed on a semiconductor substrate in which a buffer layer having an impurity concentration of at least $10^{10}$ cm$^{-3}$ and at most $10^{14}$ cm$^{-3}$ is formed on a semi-insulating semiconductor having at least $10^{14}$ cm$^{-3}$ and at most $10^{16}$ cm$^{-3}$ p-type or n-type impurities and at least one active layer having a p-type or n-type impurity concentration of at least $10^{15}$ cm$^{-3}$ and at most $10^{17}$ cm$^{-3}$ is formed on the buffer layer, wherein resistors are connected to all of the first to n-th gate electrodes, and all of the other ends of the resistors are coupled to the same electric potential.

7. The semiconductor device according to claim 6, wherein, when the multi-gate FET is in an OFF-state, a first gate-drain capacitance value is set to not more than ⅔ of a first gate-source capacitance value and an n-th gate-source capacitance value is set to not more than ⅔ of an n-th gate-drain capacitance value.

8. The semiconductor device according to claim 6, wherein an electrode is formed on the buffer layer, and a voltage between a first voltage as an upper limit and a second voltage as a lower limit is applied to the electrode.

9. The semiconductor device according to claim 6, wherein for $1 \leq m \leq n-1$ (m is an integer), an electrode is provided in a region on the active layer between an m-th gate electrode and an (m+1)th gate electrode, and a voltage between a first voltage as an upper limit and a second voltage as a lower limit is applied to the electrode.

10. The semiconductor device according to claim 6, wherein the buffer layer is formed by laminating two or more layers of different kinds of semiconductors, an electrode is formed on any of the layers of the buffer layer, and a voltage between a first voltage as an upper limit and a second voltage as a lower limit is applied to the electrode.

* * * * *